(12) United States Patent
Knudsen

(10) Patent No.: US 7,079,611 B2
(45) Date of Patent: Jul. 18, 2006

(54) SYSTEM AND METHOD FOR SYNCHRONIZING AN ASYNCHRONOUS FREQUENCY FOR USE IN A DIGITAL SYSTEM

(75) Inventor: Niels Knudsen, Humlebaek (DK)

(73) Assignee: National Instruments Corporation, Austin, TX (US)

( * ) Notice: Subject to any disclaimer, the term of this patent is extended or adjusted under 35 U.S.C. 154(b) by 812 days.

(21) Appl. No.: 09/882,473

(22) Filed: Jun. 14, 2001

(65) Prior Publication Data

US 2002/0191726 A1   Dec. 19, 2002

(51) Int. Cl.
*H04L 7/00* (2006.01)
(52) U.S. Cl. .................. 375/354; 375/376; 327/147; 327/156; 327/162; 331/18; 331/50
(58) Field of Classification Search ............. 375/354, 375/371, 373, 375, 376; 327/147, 150, 156, 327/159, 162; 331/17, 18, 25, 34, 1 A, 48, 331/50, 58
See application file for complete search history.

(56) References Cited

U.S. PATENT DOCUMENTS

| | | | | |
|---|---|---|---|---|
| 4,954,824 A | * | 9/1990 | Yamada et al. ............ | 341/61 |
| 5,638,010 A | | 6/1997 | Adams | |
| 6,021,504 A | * | 2/2000 | Yamasaki ................. | 713/400 |
| 6,104,222 A | * | 8/2000 | Embree .................... | 327/156 |
| 6,275,553 B1 | * | 8/2001 | Esaki ....................... | 375/371 |
| 6,462,592 B1 | * | 10/2002 | Yoo ......................... | 327/147 |
| 6,664,860 B1 | * | 12/2003 | Fallisgaard et al. ....... | 331/18 |

* cited by examiner

*Primary Examiner*—Dac V. Ha
(74) *Attorney, Agent, or Firm*—Meyertons Hood Kivlin Kowert & Goetzel, P.C.; Jeffrey C. Hood

(57) ABSTRACT

A system and method for accurately detecting an asynchronous frequency within a synchronous digital system. The improved system and method preconditions the asynchronous frequency so that it does not introduce additional phase noise at low frequencies within a digital PLL. The system comprises a digitally controlled oscillator, having a preconditioner and a digital phase locked loop. The preconditioner receives an input clock signal and outputs a modified clock signal that is synchronized to a master clock signal. The digital phase locked loop receives the modified clock signal output from the preconditioner and outputs an output clock signal that is a version of the input clock signal synchronized to the master clock signal. The preconditioner preferably has a higher bandwidth than the digital PLL, and the preconditioner operates to noise shape phase noise of the synchronization to higher frequencies. The digital phase locked loop may then operate to remove the phase noise at the higher frequencies. Due to the operation of the preconditioner, the digital phase locked loop does not introduce phase noise to the synchronized version of the input clock signal.

6 Claims, 2 Drawing Sheets

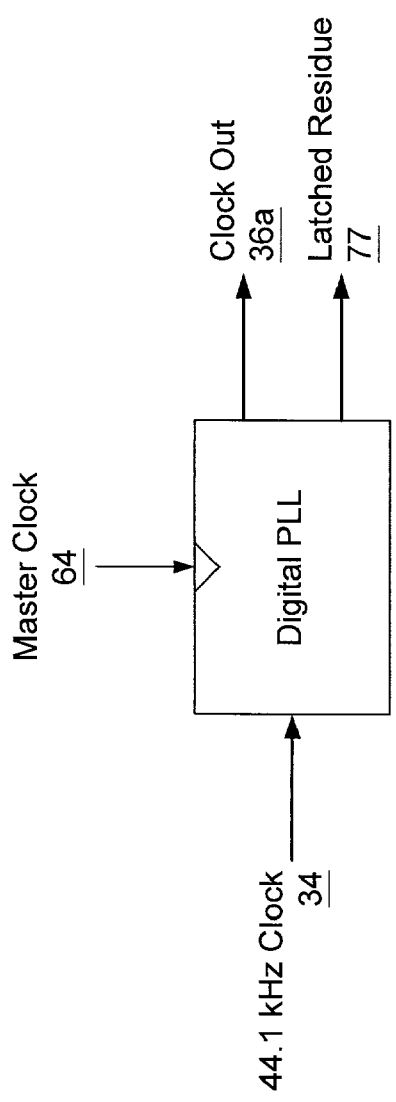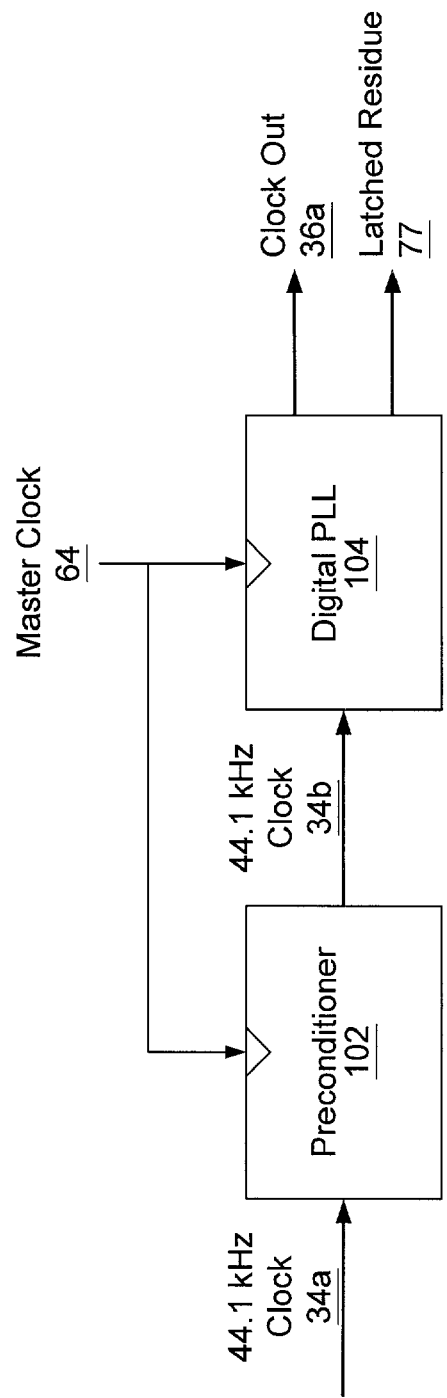

SYSTEM AND METHOD FOR SYNCHRONIZING AN ASYNCHRONOUS FREQUENCY FOR USE IN A DIGITAL SYSTEM

FIELD OF THE INVENTION

This invention relates to digitally controlled oscillators, particularly for use in a digital phase-locked loop (PLL), for accurately detecting an asynchronous frequency within a synchronous digital system. More particularly, the invention relates to a method for preconditioning the asynchronous frequency so that it does not introduce additional phase noise at low frequencies within the digital PLL.

DESCRIPTION OF THE RELATED ART

Analog-to-digital converters (ADCs) are circuits used to convert signals from the analog domain, where the signals are represented by continuous quantities such as voltage and current, to the digital domain, where the signals are represented by numbers. These circuits can be implemented in a large number of ways. Established A/D conversion techniques include flash, delta-sigma (or sigma-delta), sub-ranging, successive approximation, and integrating.

One example of an A/D converter is an over-sampled A/D converter. Oversampled AID converters, often denoted as "delta-sigma converters" or "sigma-delta converters" are well known in the art. Delta-sigma (D/S) converters have gained in popularity due primarily to their ability to realize high resolution analog-to-digital conversion in mixed signal VLSI processes.

A D/S converter essentially digitizes an analog signal at a very high sampling rate (oversampling) in order to perform a noise shaping function. Digital filtering after the noise shaping allows the D/S converter to achieve a high resolution when compared with conventional A/D converters. Decimation is thereafter used to reduce the effective sampling rate back to the "Nyquist" rate.

Oversampled sigma-delta digital-to-analog (D/A) and analog-to-digital (A/D) converters use interpolation and decimation filters, respectively. Such filters typically require a high frequency clock signal that is a binary multiple of either an input sample rate or an output sample rate. In other words, the interpolation filter in the D/A converter requires a high frequency clock signal that is a simple binary multiple of the input sample rate, whereas the A/D converter, using a decimation filter, usually requires a high frequency clock signal that is a simple binary multiple of the output sample rate.

As described in the Background section of U.S. Pat. No. 5,638,010, in systems that must accommodate a variety of input sample rates, generating the required high frequency master clock that is a multiple of the input sample rate can be difficult. Frequently, an analog phase-locked loop (PLL) has been required to generate this clock, which limits the ability to use an asynchronous master clock. U.S. Pat. No. 5,638,010 notes that it would be preferable to use a digital PLL to provide a single digital integrated circuit which accommodates a number of input sample rates. A digital PLL would eliminate the requirement of an analog PLL and allow a user to provide only an asynchronous master clock instead of a master clock phase-locked to the input rate. U.S. Pat. No. 5,638,010 notes that Analog Devices, Inc. has a product called the AD1843 which comprises such a system, although this product disadvantageously uses a complex noise shaping scheme to overcome the problems caused by using a digital PLL.

U.S. Pat. No. 5,638,010 describes a method to accurately detect an asynchronous frequency within a synchronous digital system. The asynchronous frequency is synchronized to a master (synchronous) clock and a residue is output. The system uses a digital PLL. An inherent advantage to the described system is that phase noise in the input asynchronous frequency is filtered for frequencies above the PLL system bandwidth. Unfortunately this system also adds phase noise to the input that can not be removed by the digital PLL for frequencies below the system bandwidth.

More particularly, FIG. 1 shows the interface signals to the digital PLL in U.S. Pat. No. 5,638,010. The digital PLL receives a high frequency master clock (MASTER CLOCK, 64) an asynchronous low frequency sample clock (44.1 kHz CLOCK, 34). The PLL outputs a CLOCK OUT, 36*a*, which is a synchronized version of the clock input (44.1 kHz CLOCK, 34). Because of the synchronization, a time difference between the clock input 34 and the clock output 36*a* is introduced. The PLL also outputs a LATCHED RESIDUE, 77, which is a digital number that attempts to describe the time difference. The time difference contains useful information for an interpolation filter.

The PHASE DETECTOR 80 inherent to the Digital PLL (see FIG. 3 of U.S. Pat. No. 5,638,010) contains a synchronization of the clock input 34. This is described in the text for the patent at column 6, line 3, which states: "In the digital PLL, for the phase detector, if the input signal is asynchronous relative to the master clock, one or more synchronizing latches are normally used to prevent metastability problems."

Because of the synchronization, phase noise is added to the input signal. The digital PLL is to some extent insensitive to this noise because it contains a loop filter 86 that attenuates noise above its cut off frequency. However, noise below the loop filter cut off frequency is not removed.

Therefore, an improved system and method is desired for accurately detecting an asynchronous frequency within a synchronous digital system that does not introduce additional phase noise at low frequencies within the digital PLL.

SUMMARY OF THE INVENTION

One embodiment of the present invention comprises a system and method for accurately detecting an asynchronous frequency within a synchronous digital system. The improved system and method preconditions the asynchronous frequency so that it does not introduce additional phase noise at low frequencies within a digital PLL.

In one embodiment, the system comprises a digitally controlled oscillator, wherein the digitally controlled oscillator comprises a preconditioner and a digital phase locked loop. The preconditioner receives an input clock signal and a master clock signal. The preconditioner outputs a modified clock signal that is synchronized to the master clock signal. The digital phase locked loop is coupled to receive the modified clock signal output from the preconditioner, wherein the digital phase locked loop also receives the master clock signal. The digital phase locked loop outputs an output clock signal, wherein the output clock signal is a version of the input clock signal synchronized to the master clock signal. Due to the operation of the preconditioner, the digital phase locked loop does not introduce phase noise to the synchronized version of the input clock signal.

The preconditioner preferably has a higher bandwidth than the digital PLL. Thus the preconditioner may operate to noise shape phase noise of the synchronization to higher frequencies. The digital phase locked loop may then operate to remove the phase noise at the higher frequencies.

In one embodiment, the preconditioner comprises a phase detector, a loop filter, a voltage controlled oscillator (VCO), and a latch connected in series. The phase detector has a first input which receives the input clock signal and a second input. The latch has an input coupled to the output of the VCO and an input which receives the master clock signal. The latch includes an output which generates the modified clock signal, wherein the latch synchronizes the modified clock signal to the master clock signal. The latch output is also coupled to the second input of the phase detector to provide the modified clock signal to the phase detector. The preconditioner preferably has a loop gain that operates to attenuate phase noise introduced internally to the preconditioner.

BRIEF DESCRIPTION OF THE DRAWINGS

A better understanding of the present invention can be obtained when the following detailed description of the preferred embodiment is considered in conjunction with the following drawings, in which:

FIG. 1 illustrates the interface signals to the digital PLL in U.S. Pat. No. 5,638,010;

FIG. 2 illustrates one embodiment of the invention; and

Figure 3:
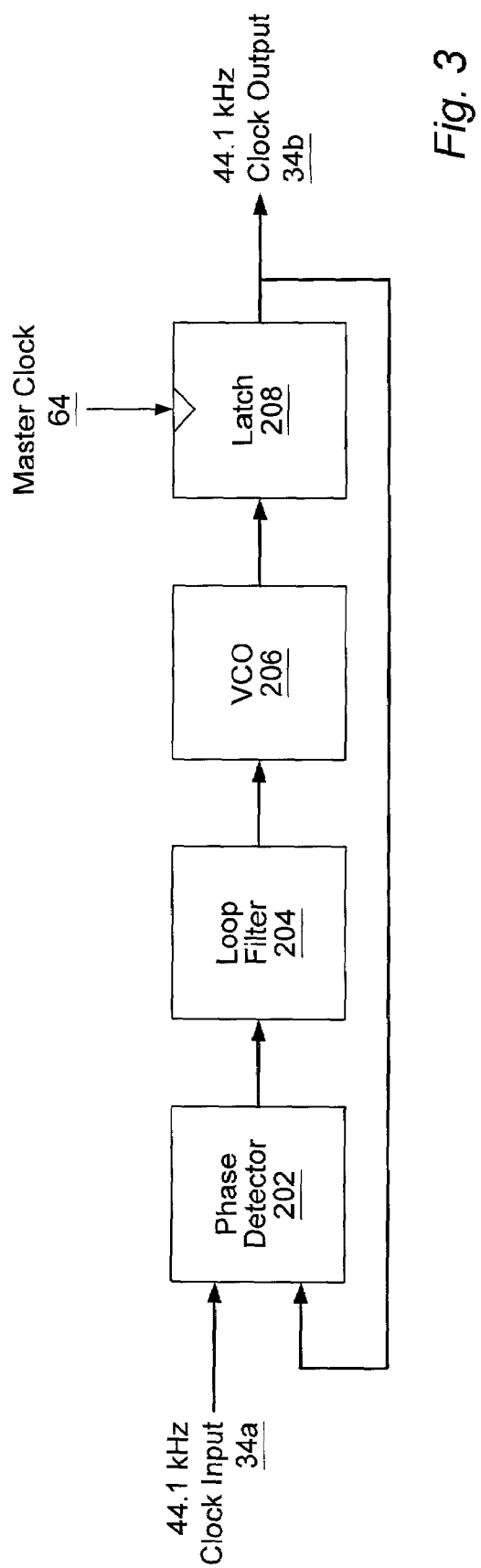
FIG. 3 is a block diagram of the preconditioner of FIG. 2.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DEATILED DESCRIPTION OF THE PREFERRED EMBODIMENTS

Incorporation by Reference

The following are hereby incorporated by reference as though fully and completely set forth herein:

U.S. Pat. No. 5,638,010 titled "Digitally controlled oscillator for a phase-locked loop providing a residue signal for use in continuously variable interpolation and decimation filters" which issued on Jun. 10, 1997 is hereby incorporated by reference in its entirety as though fully and completely set forth herein.

FIG. 2—Embodiment of the Invention

FIG. 2 illustrates one embodiment of a system for detecting an asynchronous frequency within a synchronous digital system. As shown, the system includes a digital PLL 104 and a preconditioner 102. The preconditioner 102 includes an input which receives a clock signal 34a. The clock signal 34a may be any frequency, but in this embodiment is 44.1 kHz. The preconditioner 102 receives a master clock 64. The preconditioner 102 outputs a modified or conditioned clock signal 34b to the digital PLL 104. The modified clock signal 34b output by the preconditioner 102 is preferably synchronized to the master clock signal 64. The digital PLL 104 also receives the master clock 64. The digital PLL 104 outputs a Clock Out signal 36a and a Latched Residue signal 77. The Clock Out signal 36a is a version of the input clock signal 34a synchronized to the master clock signal 64.

Thus, as shown in FIG. 2, the preconditioner 102 is inserted before the clock input 34 signal. The input 34a to the preconditioner may be similar or identical to the clock signal 34 input to the digital PLL in the system described in U.S. Pat. No. 5,638,010. The preconditioner 102 includes logic for preconditioning the asynchronous frequency so that it does not introduce additional phase noise at low frequencies within the digital PLL. The preconditioner outputs a clock signal 34b, that does not cause the digital PLL 104 to introduce additional phase noise to the clock signal.

The system comprising preconditioner 102 and digital PLL 104 receives a high frequency master clock 64 and an asynchronous low frequency sample clock (e.g., 44.1 kHz clock) 34. The preconditioner 102 preconditions the input clock signal 34a and provides a modified clock signal 34b to the digital PLL 104. The digital PLL 104 outputs an output clock signal 36a, which is a synchronized version of the input clock input 34 (e.g., 44.1 kHz). The modified clock signal 34b provided by the preconditioner 102 helps ensure that the digital PLL 104 does not introduce additional phase noise to the clock signal.

FIG. 3—Preconditioner Block Diagram

FIG. 3 is a block diagram for the preconditioner. In one embodiment, the preconditioner comprises an analog phase detector 202, an analog loop filter 204, an analog VCO (voltage controlled oscillator) 206 and a latch 208. The phase detector 202 receives the clock input 34a. The phase detector 202 provides an output to the loop filter 204, which in turn provides an output to the VCO 206, which provides an output to the latch 208. The latch 208 receives the master clock 64. The latch 208 outputs the clock output 34b of the preconditioner 102. The clock output 34b of the latch 208 is also fed back to an input of the phase detector 202.

The phase noise introduced internal to the preconditioner 102 is attenuated by the loop gain factor of the loop of the preconditioner 102. This causes the phase noise of the synchronization to be noise shaped in a way that is equivalent to a delta-sigma A/D converter loop. The phase noise of the synchronization is noise-shaped to higher frequencies, where it can be removed by the subsequent digital PLL. For this reason, the preconditioner 102 preferably has a higher bandwidth compared to the digital PLL 104 so that phase noise gets pushed to frequencies higher than the digital PLL bandwidth.

The preconditioner 102 also operates to noise shape the phase noise of the VCO 206, so that phase noise of the VCO 206 is not important. This allows for an inexpensive VCO 206. In the preferred embodiment the preconditioner loop should be of at least second order in order to avoid idle tones within the loop. The second order loop also preferably has zero phase delay.

The latch 208 serves to synchronize the output of the VCO 206 to the master clock 64 of the digital PLL 104. Because the output 34b of the preconditioner 102 is synchronized to the master clock 64, the subsequent digital PLL 104 does not introduce any additional phase noise.

Numerous variations and modifications will become apparent to those skilled in the art once the above disclosure is fully appreciated. It is intended that the following claims be interpreted to embrace all such variations and modifications.

What is claimed is:

1. A digitally controlled oscillator, comprising:

an analog preconditioner, wherein the analog preconditioner is operable to receive an input clock signal and a master clock signal, wherein the analog preconditioner is configured to output a modified clock signal that is synchronized to the master clock signal, wherein the analog preconditioner is configured to noise shape phase noise of the synchronization to higher frequencies; and a digital phase locked loop coupled to receive the modified clock signal output from the analog preconditioner, wherein the digital phase locked loop is also operable to receive the master clock signal, wherein the digital phase locked loop is configured to output an output clock signal, wherein the output clock signal is a version of the input clock signal synchronized to the master clock signal.

2. The digitally controlled oscillator of claim 1, wherein the digital phase locked loop is configured to remove the phase noise at the higher frequencies.

3. The digitally controlled oscillator of claim 2, wherein the analog preconditioner has a higher bandwidth than the digital PLL.

4. The digitally controlled oscillator of claim 1, wherein the analog preconditioner includes a loop having a loop gain, wherein the loop gain operates to attenuate phase noise introduced internal to the analog preconditioner.

5. The digitally controlled oscillator of claim 1, wherein the analog preconditioner comprises:

a phase detector including a first input which is operable to receive the input clock signal and a second input, wherein the phase detector also includes an output;

a loop filter including an input coupled to the output of the phase detector and also including an output;

a voltage controlled oscillator (VCO) including an input coupled to the output of the loop filter and also including an output;

a latch including an input coupled to the output of the VCO, an input which is operable to receive the master clock signal, and also including an output which is operable to generate the modified clock signal, wherein the latch is configured to synchronize the modified clock signal to the master clock signal, wherein the output of the latch is coupled to the second input of the phase detector to provide the modified clock signal to the phase detector.

6. The digitally controlled oscillator of claim 5, wherein the analog preconditioner is configured to noise shape phase noise of the VCO to higher frequencies.

* * * * *